(12) United States Patent
Peng et al.

(10) Patent No.: US 12,394,603 B2
(45) Date of Patent: Aug. 19, 2025

(54) MULTIZONE GAS DISTRIBUTION PLATE FOR TRENCH PROFILE OPTIMIZATION

(71) Applicant: LAM RESEARCH CORPORATION, Fremont, CA (US)

(72) Inventors: Gordon Peng, San Jose, CA (US); Craig Rosslee, San Jose, CA (US); Dan Marohl, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 525 days.

(21) Appl. No.: 17/792,157

(22) PCT Filed: Jan. 8, 2021

(86) PCT No.: PCT/US2021/012604
§ 371 (c)(1),
(2) Date: Jul. 12, 2022

(87) PCT Pub. No.: WO2021/146099
PCT Pub. Date: Jul. 22, 2021

(65) Prior Publication Data
US 2023/0091524 A1    Mar. 23, 2023

Related U.S. Application Data

(60) Provisional application No. 62/960,390, filed on Jan. 13, 2020.

(51) Int. Cl.
*H01J 37/32* (2006.01)
*C23C 16/44* (2006.01)
(Continued)

(52) U.S. Cl.
CPC .... *H01J 37/32449* (2013.01); *C23C 16/4409* (2013.01); *C23C 16/45565* (2013.01); *C23C 16/509* (2013.01); *H01J 2237/327* (2013.01)

(58) Field of Classification Search
CPC .......... H01J 37/32449; H01J 2237/327; C23C 16/4409; C23C 16/45565; C23C 16/509
See application file for complete search history.

(56) References Cited

U.S. PATENT DOCUMENTS

| 8,475,625 B2 | 7/2013 | Pamarthy et al. |
| 10,577,690 B2 | 3/2020 | Nguyen et al. |
| (Continued) | | |

FOREIGN PATENT DOCUMENTS

| CN | 109155242 A | 1/2019 |
| JP | 2006165399 A | 6/2006 |
| (Continued) | | |

OTHER PUBLICATIONS

International Search Report and Written Opinion of the ISA issued in PCT/US2021/012604, mailed Apr. 30, 2021; ISA/KR.

(Continued)

*Primary Examiner* — Yuechuan Yu (57) ABSTRACT

A gas distribution device for a substrate processing system includes an upper plate including a first hole and a plurality of second holes and a lower plate. The lower plate includes a recessed region formed in one of an upper surface of the lower plate and a lower surface of the upper plate. The recessed region defines a plenum volume between the upper plate and the lower plate. The lower plate further includes a raised fence located within the recessed region. The fence separates the plenum volume into a first plenum and a second plenum, the first plenum is in fluid communication with the first hole, and the second plenum is in fluid communication with the plurality of second holes.

20 Claims, 4 Drawing Sheets

(51) Int. Cl.
*C23C 16/455* (2006.01)
*C23C 16/509* (2006.01)

(56) References Cited

U.S. PATENT DOCUMENTS

| | | | | |
|---|---|---|---|---|
| 2008/0236495 | A1* | 10/2008 | Tompa | C23C 16/45572 118/724 |
| 2009/0117746 | A1* | 5/2009 | Masuda | C23C 16/45561 118/723 R |
| 2012/0234945 | A1* | 9/2012 | Olgado | B05B 1/005 239/589 |
| 2017/0335456 | A1* | 11/2017 | Nguyen | C23C 16/45574 |
| 2019/0032211 | A1* | 1/2019 | Tucker | H01L 21/4807 |

FOREIGN PATENT DOCUMENTS

| | | |
|---|---|---|
| JP | 2009536461 A | 10/2009 |
| JP | 2013211268 A | 10/2013 |
| JP | 201636018 A | 3/2016 |
| JP | 2019517143 A | 6/2019 |
| TW | 201213603 A | 4/2012 |
| TW | 201239132 A | 10/2012 |
| TW | 201920753 A | 6/2019 |
| WO | WO-2011159615 A2 | 12/2011 |
| WO | WO-2022060688 A1 | 3/2022 |

OTHER PUBLICATIONS

Japanese Office Action for Japanese Application No. 2022-542658 dated Oct. 15, 2024.
Taiwanese Office Action for Taiwanese Application No. 110101035 dated Aug. 23, 2024.
Singapore Search Report and Written Opinion for Singapore Application No. 11202251232R mailed Mar. 21, 2025.

* cited by examiner

MULTIZONE GAS DISTRIBUTION PLATE FOR TRENCH PROFILE OPTIMIZATION

CROSS-REFERENCE TO RELATED APPLICATIONS

This application is a U.S. National Phase Application under 35 U.S.C. 371 of International Application No. PCT/US2021/012604, filed on Jan. 8, 2021, which claims the benefit of U.S. Provisional Application No. 62/960,390, filed on Jan. 13, 2020. The entire disclosures of the applications referenced above are incorporated herein by reference.

FIELD

The present disclosure relates to a gas distribution device for injecting process gases into a processing chamber in a substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes.

A substrate may be arranged on a substrate support, such as a pedestal, an electrostatic chuck (ESC), etc. in a processing chamber of the substrate processing system and a gas mixture including one or more process gases may be introduced into the processing chamber. For example, during plasma-based etching processes, a gas mixture including one or more precursors is introduced into the processing chamber and plasma is struck to etch the substrate.

SUMMARY

A gas distribution device for a substrate processing system includes an upper plate including a first hole and a plurality of second holes and a lower plate. The lower plate includes a recessed region formed in one of an upper surface of the lower plate and a lower surface of the upper plate. The recessed region defines a plenum volume between the upper plate and the lower plate. The lower plate further includes a raised fence located within the recessed region. The fence separates the plenum volume into a first plenum and a second plenum, the first plenum is in fluid communication with the first hole, and the second plenum is in fluid communication with the plurality of second holes.

In other features, the upper plate includes a receptacle and the first hole and the plurality of second holes are located within the receptacle. The receptacle is configured to receive a central injector including a first channel and a second channel. The gas distribution device further includes the central injector, the first hole is centrally located within the receptacle, and the first channel is aligned with and in fluid communication with the first hole. The second channel includes an annular bottom portion that is aligned with and in fluid communication with the plurality of second holes.

In other features, the first hole is centrally located in the upper plate and the plurality of second holes are located radially outward of the first hole. An area of the first hole is substantially the same as an overall area of the plurality of second holes. The first plenum and the second plenum are coplanar. A height of the fence is the same as a height of an outer portion of a corresponding one of the lower plate and the upper plate surrounding the recessed region.

In other features, the first plenum includes a first plurality of lobes, the fence includes a second plurality of lobes, and each of the second plurality of lobes surrounds respective ones of the first plurality of lobes. The first plenum has a cloverleaf shape including four lobes. The second plenum includes a third plurality of lobes located between adjacent pairs of the second plurality of lobes of the fence. The fence includes switchbacks that connect the adjacent pairs of the second plurality of lobes and protrude inward between adjacent pairs of the first plurality of lobes. The switchbacks define flow channels in respective ones of the third plurality of lobes. The flow channels extend radially outward into the respective ones of the third plurality of lobes between the adjacent pairs of the first plurality of lobes and the adjacent pairs of the second plurality of lobes. Radially inward ends of the flow channels are aligned with the second plurality of holes.

In other features, the lower plate includes a first plurality of holes extending from the first plenum to lower surface of the lower plate and a second plurality of holes extended from the second plenum to the lower surface of the lower plate. The second plurality of holes is located radially outward of the first plurality of holes.

A gas distribution device for a substrate processing system includes an upper plate including a first hole and a plurality of second holes and a lower plate. The lower plate includes a recessed region formed in one of an upper surface of the lower plate and a lower surface of the upper plate. The recessed region defines a plenum volume between the upper plate and the lower plate. The lower plate further includes a plurality of grooves located within the recessed region and a plurality of sealing members located in respective ones of the plurality of grooves. The plurality of sealing members separates the plenum volume into a first plenum and a plurality of second plenums, the first plenum is in fluid communication with the first hole, and the plurality of second plenums is in fluid communication with the plurality of second holes.

In other features, the sealing members are O-rings.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In substrate processing systems, a gas mixture including one or more process gases may be introduced into the processing chamber using a gas distribution device. In some examples, the gas distribution device includes a centrally located gas injector configured to inject gases into the processing chamber (e.g., using a nozzle and/or diverter to distribute the gases). In other examples, the gas distribution device includes a showerhead defining a plenum. Gases are supplied to the plenum and flow out of the plenum and into the processing chamber through a plurality of holes arranged in a substrate-facing surface or faceplate of the showerhead. While the holes may be provided in different arrangements or zones of the showerhead, distribution of the gases may be biased in accordance with respective distances of the holes from a center injection point.

A gas distribution device or plate according to the present disclosure includes two or more gas distribution zones. For example, the gas distribution device includes two plates (e.g., an upper plate and a lower plate) and a plenum volume defined between the upper plate and the lower plate. An interface between the upper plate and the lower plate is configured to separate the plenum volume into first and second plenums. Gases are introduced into the plenums through the upper plate. For example, a central injector is configured to separately supply gases into the plenums via respective holes in the upper plate. The interface maintains separation of the gases within the first and second plenums.

For example, the interface may correspond to a raised or recessed regions formed in an upper surface of the lower plate. Conversely, a lower surface of the upper plate may be substantially flat. Accordingly, the recessed regions in the upper surface of the lower plate define the plenums. In some examples, the recessed regions are formed in a lower surface of the upper plate and the upper surface of the lower plate is substantially flat.

In another example, the plenum volume may correspond to a single recessed region formed in the upper surface of the lower plate or a lower surface of the upper plate. In this example, the recessed region may include a plurality of grooves defining respective zones and respective O-rings arranged in the grooves. The O-rings maintain separation of the gases within the respective zones defined by the grooves.

Figure 1:
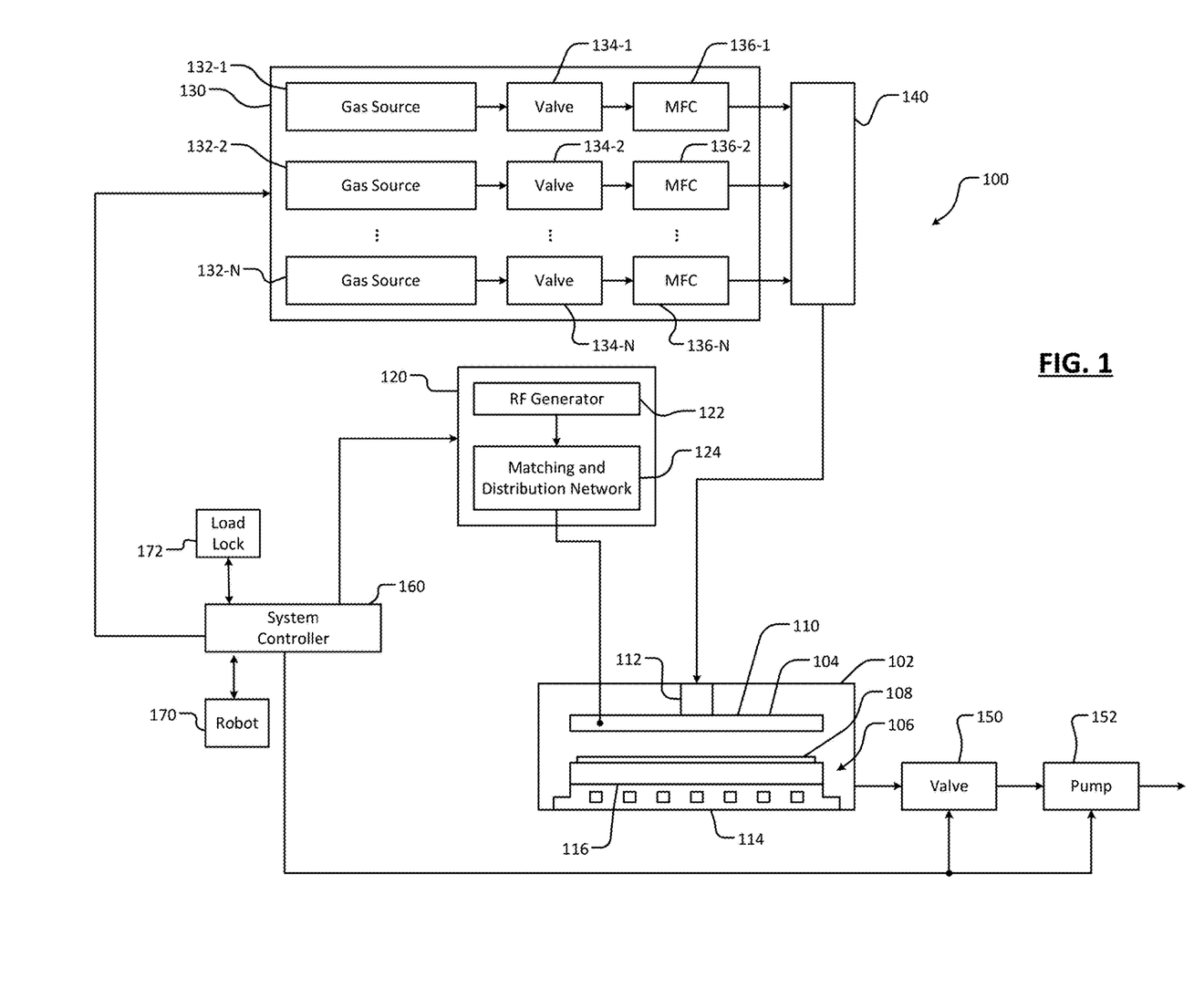
FIG. 1 is a functional block diagram of an example substrate processing system according to the principles of the present disclosure.

Referring now to FIG. 1, an example substrate processing system 100 for performing processes including, but not limited to, deposition and etching (e.g., using radio frequency, or RF, plasma) is shown. The substrate processing system 100 includes a processing chamber 102 that encloses other components of the substrate processing system 100. The substrate processing system 100 includes an upper electrode 104 and a substrate support 106, such as an electrostatic chuck (ESC). During operation, a substrate 108 is arranged on the substrate support 106.

For example only, the upper electrode 104 may include a gas distribution device such as a showerhead 110 that introduces and distributes process gases into the processing chamber 102. In some examples, the showerhead 110 may include a stem portion 112 including one end connected to a top surface of the processing chamber 102. The stem portion 112 may correspond to a central injector configured to receive process gases and supply the process gases to the processing chamber 102 through the showerhead 110.

The showerhead 110 is generally cylindrical and extends radially outwardly from an opposite end of the stem portion 112 at a location that is spaced from the top surface of the processing chamber 102. A substrate-facing surface or faceplate of the showerhead 110 includes a plurality of holes through which process gas or purge gas flows. In other examples, the showerhead 110 may be arranged adjacent to or above the upper surface of the processing chamber 102. In some examples, the showerhead 110 may be incorporated within and/or function as a lid of the processing chamber 102. The showerhead 110 according to the present disclosure includes two or more gas distribution zones as described below in more detail.

The substrate support 106 includes a conductive baseplate 114 that acts as a lower electrode. The baseplate 114 supports a ceramic layer 116, which may correspond to a ceramic heating plate. An RF generating system 120 generates and outputs an RF voltage to one of the upper electrode 104 and the lower electrode (e.g., the baseplate 114 of the substrate support 106). The other one of the upper electrode 104 and the baseplate 114 may be DC grounded, AC grounded, or floating. For example only, the RF generating system 120 may include an RF voltage generator 122 that generates the RF voltage that is fed by a matching and distribution network 124 to the upper electrode 104 or the baseplate 114. In other examples, the plasma may be generated inductively or remotely.

As described herein, the RF generating system 120 may correspond to a transformer coupled plasma (TCP) system. In other examples, the principles of the present disclosure may be implemented in other types of substrate processing systems, such as capacitively coupled plasma (CCP) systems, CCP cathode systems, remote microwave plasma generation and delivery systems, etc.

A gas delivery system 130 includes one or more gas sources 132-1, 132-2, . . . , and 132-N (referred to collectively as gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (referred to collectively as valves 134) and mass flow controllers 136-1, 136-2, . . . , and 136-N (referred to collectively as mass flow controllers 136) to a manifold 140. An output of the manifold 140 is fed to the processing chamber 102. For example only, the output of the manifold 140 is fed to the showerhead 110.

A valve 150 and pump 152 evacuate reactants from the processing chamber 102. A system controller 160 controls components of the substrate processing system 100. A robot 170 delivers substrates onto, and removes substrates from, the substrate support 106. For example, the robot 170 may transfer substrates between the substrate support 106 and a load lock 172. Although shown as separate controllers, the temperature controller 142 may be implemented within the system controller 160.

Figure 2:
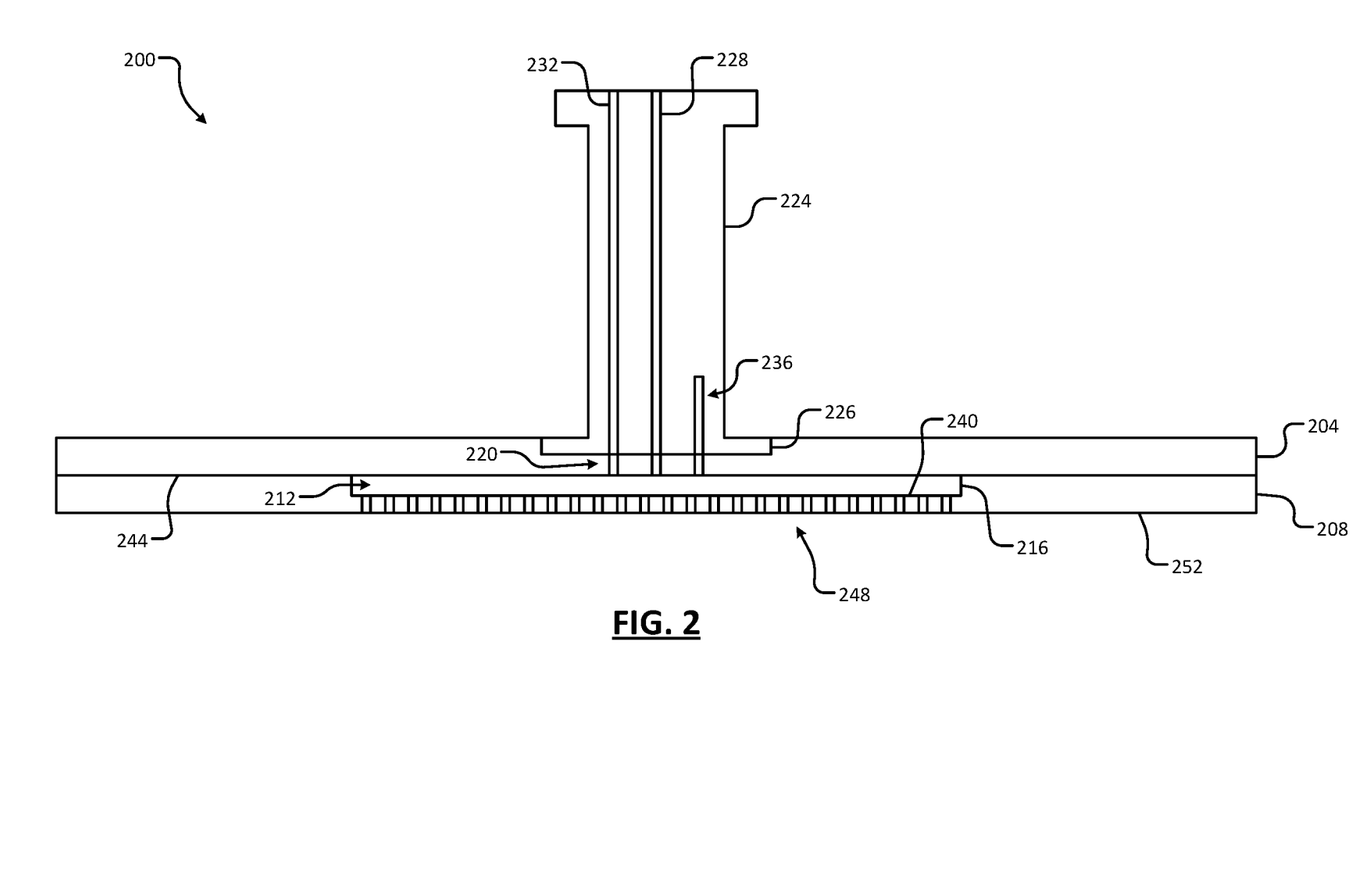
FIG. 2 is an example gas distribution device including two gas distribution zones according to the principles of the present disclosure.

FIG. 2 shows an example gas distribution device 200 (e.g., a showerhead) including two gas distribution zones according to the principles of the present disclosure. The gas distribution device includes two plates (e.g., an upper plate 204 and a lower plate 208) and a plenum volume 212 defined between the upper plate 204 and the lower plate 208. An interface (corresponding to a recessed region 216) between the upper plate 204 and the lower plate 208 is configured to separate the plenum volume 212 into first and second plenums (not shown in FIG. 2). Gases are introduced into the plenum volume 212 through a plurality of holes 220 in the upper plate 204 using a central injector 224. For example, the upper plate 204 includes a recessed region such as a socket or receptacle 226 configured to receive the central injector 224.

The central injector 224 is configured to separately supply gases into the first and second plenums of the plenum volume 212 via respective channels defined therein. For example, a first channel 228 supplies gases to the first plenum through a first hole (e.g., a center hole) of the plurality of holes 220. Conversely, a second channel 232 supplies gases to the second plenum through two or more second holes (e.g., outer holes) of the plurality of holes 220. For example, the second channel 232 includes an annular bottom portion 236 aligned and in fluid communication with a plurality of the holes 220.

The recessed region 216 includes raised features (not shown in FIG. 2; described below in more detail) configured to maintain separation of the gases within the first and second plenums. For example, the recessed region 216 is formed in an upper surface 240 of the lower plate 208 while a lower surface 244 of the upper plate 204 may be substantially flat. In other examples, the recessed region 216 may be formed in the lower surface 244 of the upper plate 204 and the upper surface 240 of the lower plate 208 is substantially flat. Gases supplied to the first and second plenums flow through a plurality of holes 248 in a substrate-facing surface 252 or faceplate of the lower plate 208 into the processing chamber.

In this example, the lower plate 208 may be removable and replaceable to customize the configuration of the recessed region 216 and the first plenum and the second plenum defined within the plenum volume 212. In other words, while positions of the holes 220 of the upper plate 204 may be fixed, different configurations of the lower plate 208 may be selected and installed in accordance with a desired configuration of the first and second plenum, a different configuration and flow pattern of the holes 248, etc. In some examples, the lower plate 208 may be replaced with a lower plate defining only a single gas distribution zone. The lower plate 208 may also be replaced due to wear and/or removed for repair, removed for recoating or resurfacing, etc. For example only, the upper plate 204 and the lower plate 208 may be comprised of a ceramic (e.g., alumina, quartz, etc.) and the lower plate 208 may be yttria-coated. In some examples, the lower plate 208 may be supported on a carrier ring (not shown) arranged between the lower plate 208 and sidewalls of the processing chamber. For example, the lower plate 208 may be supported on a carrier ring as described in U.S. Provisional Application No. 63/081,252, filed on Sep. 21, 2020, the entire contents of which are incorporated herein.

Figure 3A:
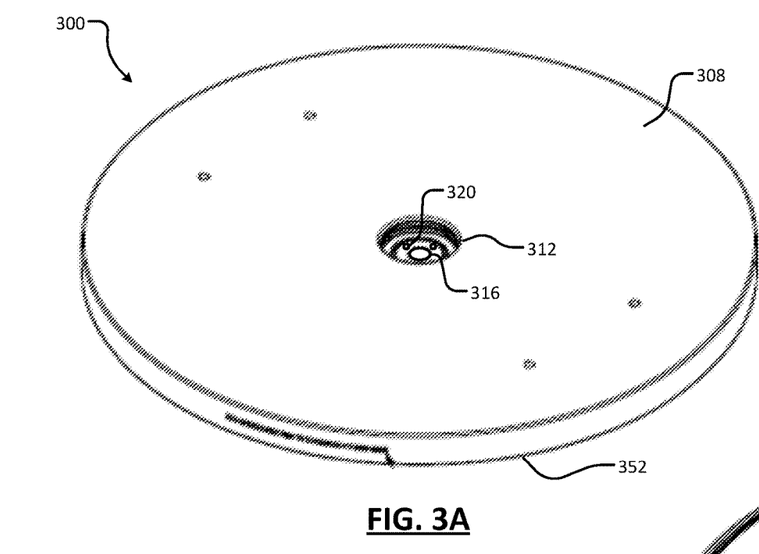
FIGS. 3A and 3B show an example upper plate and lower plate of a gas distribution device according to the principles of the present disclosure.
Figure 3B:
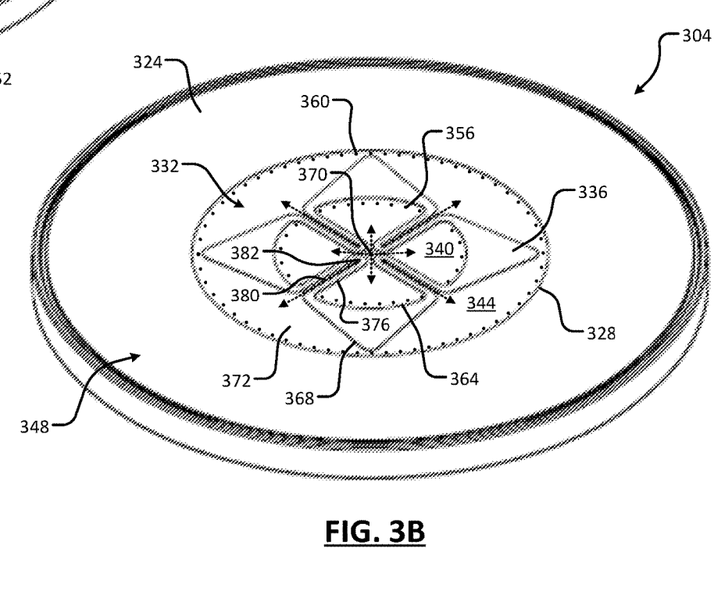

Referring now to FIGS. 3A and 3B, an example upper plate 300 and lower plate 304 according to the present disclosure are shown. An upper surface 308 of the upper plate 300 includes a recessed region such as a socket or receptacle 312 configured to receive a central injector (e.g., the central injector 224 of FIG. 2). The receptacle 312 includes a plurality of openings or holes (e.g., corresponding to the holes 220) aligned with respective channels defined within the central injector 224. For example, the receptacle 312 includes a center hole 316 aligned with the first channel 228 and a plurality of outer holes 320 (e.g., located radially outward of the center hole 316) aligned with the annular bottom portion 236 of the second channel 232. In this manner, gases supplied through the first channel 228 flow through the upper plate 300 via the center hole 316 and gases supplied through the second channel 232 flow through the upper plate 300 via the outer holes 320. An area of the center hole 316 may be substantially the same as (e.g., within +/−5% of the overall area of) the overall area of the outer holes 320 such that the flow of gases through the center hole 316 is substantially the same as the flow of gases through the outer holes 320.

An upper surface 324 of the lower plate 304 includes a recessed region 328. The recessed region 328 defines a plenum volume 332 between the upper plate 300 and the lower plate 304. A raised pattern or feature (e.g., a "fence") 336 is configured to separate the plenum volume 332 into a first (e.g., inner) plenum 340 and a second (e.g., outer) plenum 344 corresponding to respective inner and outer zones. The first plenum 340 and the second plenum 344 are coplanar. For example, a height of the fence 336 may be the same as a height of an outer portion 348 of the lower plate 304. Accordingly, the fence 336 and the outer portion 348 contact a lower surface 352 of the upper plate 300 to prevent leaking of gases between the first plenum 340 and the second plenum 344. In other words, the fence 336 defines a barrier between the first plenum 340 and the second plenum 344.

The first plenum 340 is in fluid communication with the center hole 316 and the first channel 228. Conversely, the second plenum 344 is in fluid communication with the plurality of outer holes 320 and the second channel 232. The fence 336 maintains separation of the gases respectively supplied to the first plenum 340 and the second plenum 344. Gas supplied to the first plenum 340 flows through a first plurality of holes 356 into the processing chamber. Gas supplied to the second plenum 344 flows through a second plurality of holes 360 into the processing chamber.

The lower plate 304 may be removable and replaceable to customize the configuration of the recessed region 328, the fence 336, the first plenum 340, and/or and the second plenum 344. In other words, while positions of the holes 316 and 320 of the upper plate 300 may be fixed, different configurations of the lower plate 304 may be selected and installed in accordance with desired configurations of the first plenum 340 and the corresponding first plurality of holes 356 and the second plenum 344 and the corresponding second plurality of holes 360.

For example only, as shown, the first plenum 340 has a cloverleaf pattern including four quadrants (e.g., lobes 364) surrounded by respective lobes 368 of the fence 336. Gas supplied into the first plenum 340 (e.g., at a location 370 aligned with the center hole 316) flows outward into the respective lobes 364. Conversely, the second plenum 344 includes four quadrants or lobes 372 located between respective adjacent pairs of the lobes 368 of the fence 336. The adjacent pairs of the lobes 368 of the fence 336 are connected by inwardly protruding serpentine paths (e.g., switchbacks) 376 that define respective flow channels 380 in the lobes 372 of the second plenum 344. The flow channels 380 extend radially inward from the lobes 372 of the second plenum 344 between adjacent ones of the lobes 368 of the fence 336 (or, extend radially outward from a central region of the lower plate 304). Gas supplied into the second plenum 344 (e.g., at locations 382 aligned with respective ones of the outer holes 320) flows radially outward through the flow channels 380 into the respective lobes 372.

Although as shown the first plenum 340 includes four of the lobes 364 surrounded by four of the lobes 368 of the fence 336, in other examples the lower plate 304 may include fewer (e.g., two or three) or more (e.g., five or more) of the lobes 364 and 368. Accordingly, the lower plate 304 may include fewer (e.g., two or three) or more (e.g., five or more) of the lobes 372, the serpentine paths 376, the flow channels 380, etc.

In this manner, the recessed region 328 defines two distinct gas distribution zones (e.g., a radially inner zone and a radially outer zone) corresponding to the first plenum 340 and the second plenum 344, respectively. Although gas is supplied centrally (e.g., via the central injector 224), the gas is uniformly distributed throughout the first plenum 340 and the second plenum 344.

In another example, a plenum volume may correspond to a single recessed region formed in an upper surface of a lower plate. In this example, the recessed region may include a plurality of grooves defining respective zones and respective O-rings arranged in the grooves. The O-rings maintain separation of the gases within the respective zones defined by the grooves. For example, referring now to FIGS. 4A and 4B, another example lower plate 400 including an upper surface 404 and a lower surface 408 is shown. The upper surface 404 of the lower plate 400 includes a recessed region 412 defining a plenum volume 416 between an upper plate (e.g., the upper plate 300) and the lower plate 400.

Instead of the fence 336 described above in FIGS. 3A and 3B, the recessed region 412 includes a plurality of grooves 420 and respective sealing members, such as gaskets or O-rings 424, arranged within the grooves 420. The O-rings 424 separate the plenum volume 416 into a first (e.g., inner) plenum 428 and second (e.g., outer) plenums 432 corresponding to respective inner and outer zones. The O-rings 424 and an outer portion 426 of the upper surface 404 contact a lower surface of the upper plate to prevent leaking of gases between the first plenum 428 and the second plenums 432. In other words, the O-rings 424 provide a seal between the first plenum 428 and the second plenums 432.

Figure 4A:
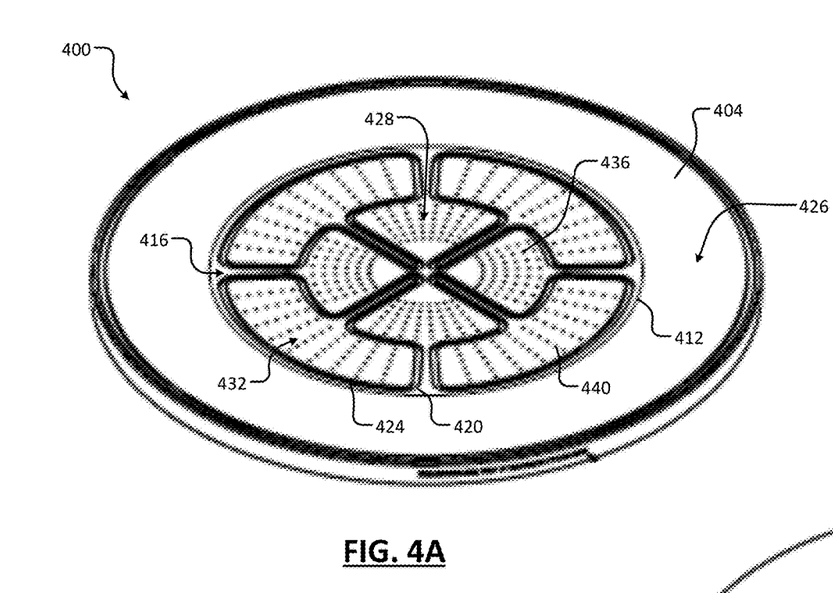
FIGS. 4A and 4B show another example lower plate of a gas distribution device according to the principles of the present disclosure.
Figure 4B:
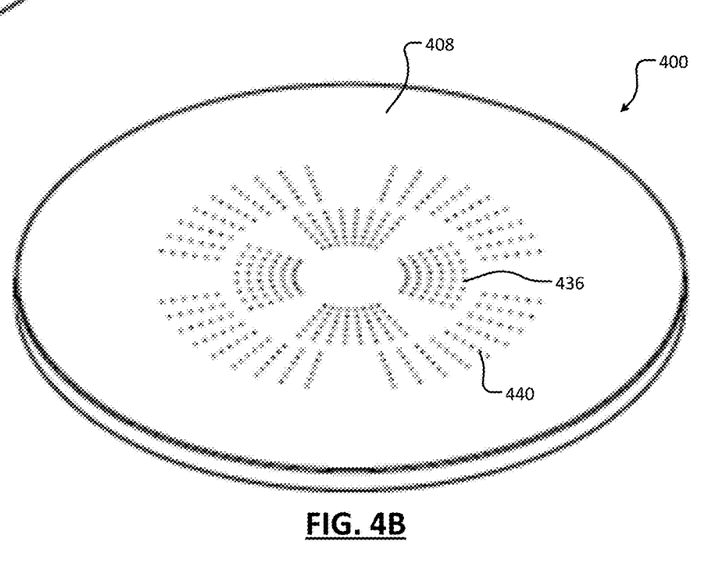

In a gas distribution device assembly with an upper plate (e.g., such as the upper plate 300) and the central injector 224, the first plenum 428 is in fluid communication with the center hole 316 and the first channel 228. Conversely, the second plenums 432 are in fluid communication with respective ones of the plurality of outer holes 320 and the second channel 232. Gas supplied to the first plenum 428 flows through a first plurality of holes 436 into the processing chamber. Gas supplied to the second plenums 432 flows through a second plurality of holes 440 into the processing chamber.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas distribution device for a substrate processing system, the gas distribution device comprising:
   an upper plate including a first hole and a plurality of second holes, wherein the plurality of second holes are positioned radially outwardly from the first hole; and
   a lower plate including
      a recessed region formed in one of (i) an upper surface of the lower plate and (ii) a lower surface of the upper plate, wherein the recessed region defines a plenum volume between the upper plate and the lower plate, and
      a raised fence located within the recessed region, wherein the raised fence separates the plenum volume into a first plenum and a second plenum, wherein the first plenum is in fluid communication with the first hole, and wherein the second plenum is in fluid communication with the plurality of second holes, and wherein the first plenum has a portion extending radially outwardly from the plurality of second holes.

2. The gas distribution device of claim 1, wherein the upper plate includes a receptacle, and wherein the first hole and the plurality of second holes are located within the receptacle.

3. The gas distribution device of claim 2, wherein the receptacle is configured to receive a central injector including a first channel and a second channel.

4. The gas distribution device of claim 3, further comprising the central injector, wherein the first hole is centrally located within the receptacle and wherein the first channel is aligned with and in fluid communication with the first hole.

5. The gas distribution device of claim 4, wherein the second channel includes an annular bottom portion that is aligned with and in fluid communication with the plurality of second holes.

6. The gas distribution device of claim 1, wherein the first hole is centrally located in the upper plate and the plurality of second holes are located radially outward of the first hole.

7. The gas distribution device of claim 1, wherein an area of the first hole is substantially the same as an overall area of the plurality of second holes.

8. The gas distribution device of claim 1, wherein the first plenum and the second plenum are coplanar.

9. The gas distribution device of claim 1, wherein a height of the raised fence is the same as a height of an outer portion of a corresponding one of the lower plate and the upper plate surrounding the recessed region.

10. The gas distribution device of claim 1, wherein the first plenum includes a first plurality of lobes, the raised fence includes a second plurality of lobes, and each of the second plurality of lobes surrounds respective ones of the first plurality of lobes, the recessed region forms a circle surrounding the first and second plurality of lobes, the second plurality of lobes each having a triangular spade-shaped portion extending away from a respective one of the first plurality of lobes.

11. The gas distribution device of claim 10, wherein the first plenum has a cloverleaf shape including four lobes.

12. The gas distribution device of claim 10, wherein the second plenum includes a third plurality of lobes located between adjacent pairs of the second plurality of lobes of the raised fence.

13. The gas distribution device of claim 12, wherein the raised fence includes switchbacks that connect the adjacent pairs of the second plurality of lobes and protrude inward between adjacent pairs of the first plurality of lobes.

14. The gas distribution device of claim 13, wherein the switchbacks define flow channels in respective ones of the third plurality of lobes.

15. The gas distribution device of claim 14, wherein the flow channels extend radially outward into the respective ones of the third plurality of lobes between the adjacent pairs of the first plurality of lobes and the adjacent pairs of the second plurality of lobes.

16. The gas distribution device of claim 14, wherein radially inward ends of the flow channels are aligned with the second plurality of holes.

17. The gas distribution device of claim 1, wherein the lower plate includes a first plurality of holes extending from the first plenum to a lower surface of the lower plate and a second plurality of holes extended from the second plenum to the lower surface of the lower plate.

18. The gas distribution device of claim 17, wherein the second plurality of holes is located radially outward of the first plurality of holes.

19. A gas distribution device for a substrate processing system, the gas distribution device comprising:
   an upper plate including a first hole and a plurality of second holes, wherein the plurality of second holes are positioned radially outwardly from the first hole; and
   a lower plate including
      a recessed region formed in one of (i) an upper surface of the lower plate and (ii) a lower surface of the upper plate, wherein the recessed region defines a plenum volume between the upper plate and the lower plate, and
      a plurality of grooves located within the recessed region, and
      a plurality of sealing members located in respective ones of the plurality of grooves, wherein the plurality of sealing members separates the plenum volume into a first plenum and a plurality of second plenums, wherein the first plenum is in fluid communication with the first hole, wherein the plurality of second plenums is in fluid communication with the plurality of second holes, and wherein the first plenum has a portion extending radially outwardly from the plurality of second holes.

20. The gas distribution device of claim 19, wherein the sealing members are O-rings.

\* \* \* \* \*